United States Patent
Yano et al.

(10) Patent No.: US 8,264,234 B2
(45) Date of Patent: Sep. 11, 2012

(54) ELECTRIC VEHICLE WITH GROUND FAULT DETECTING SYSTEM

(75) Inventors: Mitsuteru Yano, Tochigi-ken (JP); Toshiaki Takeshita, Tochigi-ken (JP)

(73) Assignee: Honda Motor Co., Ltd., Tokyo (JP)

( * ) Notice: Subject to any disclaimer, the term of this patent is extended or adjusted under 35 U.S.C. 154(b) by 179 days.

(21) Appl. No.: 12/751,247

(22) Filed: Mar. 31, 2010

(65) Prior Publication Data
US 2010/0244850 A1 Sep. 30, 2010

(30) Foreign Application Priority Data

Mar. 31, 2009 (JP) ................. 2009-086715

(51) Int. Cl.
*G01R 31/14* (2006.01)
(52) U.S. Cl. ...................... 324/510; 324/509
(58) Field of Classification Search ............... 324/510, 324/509
See application file for complete search history.

(56) References Cited

U.S. PATENT DOCUMENTS

| | | | |
|---|---|---|---|
| 6,919,726 B2 * | 7/2005 | Yudahira | 324/522 |
| 6,998,819 B2 * | 2/2006 | Jin | 320/136 |
| 7,714,587 B2 * | 5/2010 | Lindsey et al. | 324/509 |
| 2003/0001580 A1 * | 1/2003 | Kang | 324/426 |
| 2009/0153156 A1 * | 6/2009 | Ishii | 324/704 |

FOREIGN PATENT DOCUMENTS

| | | |
|---|---|---|
| JP | 8-70503 | 3/1996 |
| JP | 8-163704 | 6/1996 |
| JP | 8-226950 | 9/1996 |
| JP | 11-218554 | 8/1999 |
| JP | 2006-136151 | 5/2006 |
| JP | PCT/JP2006/315715 | * 3/2007 |
| JP | 2007-147391 | 6/2007 |
| JP | 2008-139249 | 6/2008 |
| JP | 2008-304290 | 12/2008 |

OTHER PUBLICATIONS

Japanese Office Action for Application No. 2009-086728, dated Feb. 15, 2011.

* cited by examiner

*Primary Examiner* — Jeff Natalini
(74) *Attorney, Agent, or Firm* — Nelson Mullins Riley & Scarborough LLP; Anthony A. Laurentano

(57) ABSTRACT

An electric vehicle incorporates a ground fault detecting system and has first and second ungrounded power supplies. The ground fault detecting system includes a first insulation resistance detector for detecting a first insulation resistance of the first ungrounded power supply with respect to a grounded region of the electric vehicle, and a second insulation resistance detector for detecting a second insulation resistance of the second ungrounded power supply with respect to the grounded region. The first insulation resistance detector and the second insulation resistance detector detect the first insulation resistance and the second insulation resistance at different times, respectively.

5 Claims, 21 Drawing Sheets

51

52

I : POWER SUPPLY VOLTAGE MEASUREMENT PERIOD
II : CAPACITOR VOLTAGE READING AND DISCHARGING PERIOD
III : POSITIVE-SIDE GROUND FAULT MEASURING PERIOD
IV : CAPACITOR VOLTAGE READING AND DISCHARGING PERIOD

UNDETECTABLE

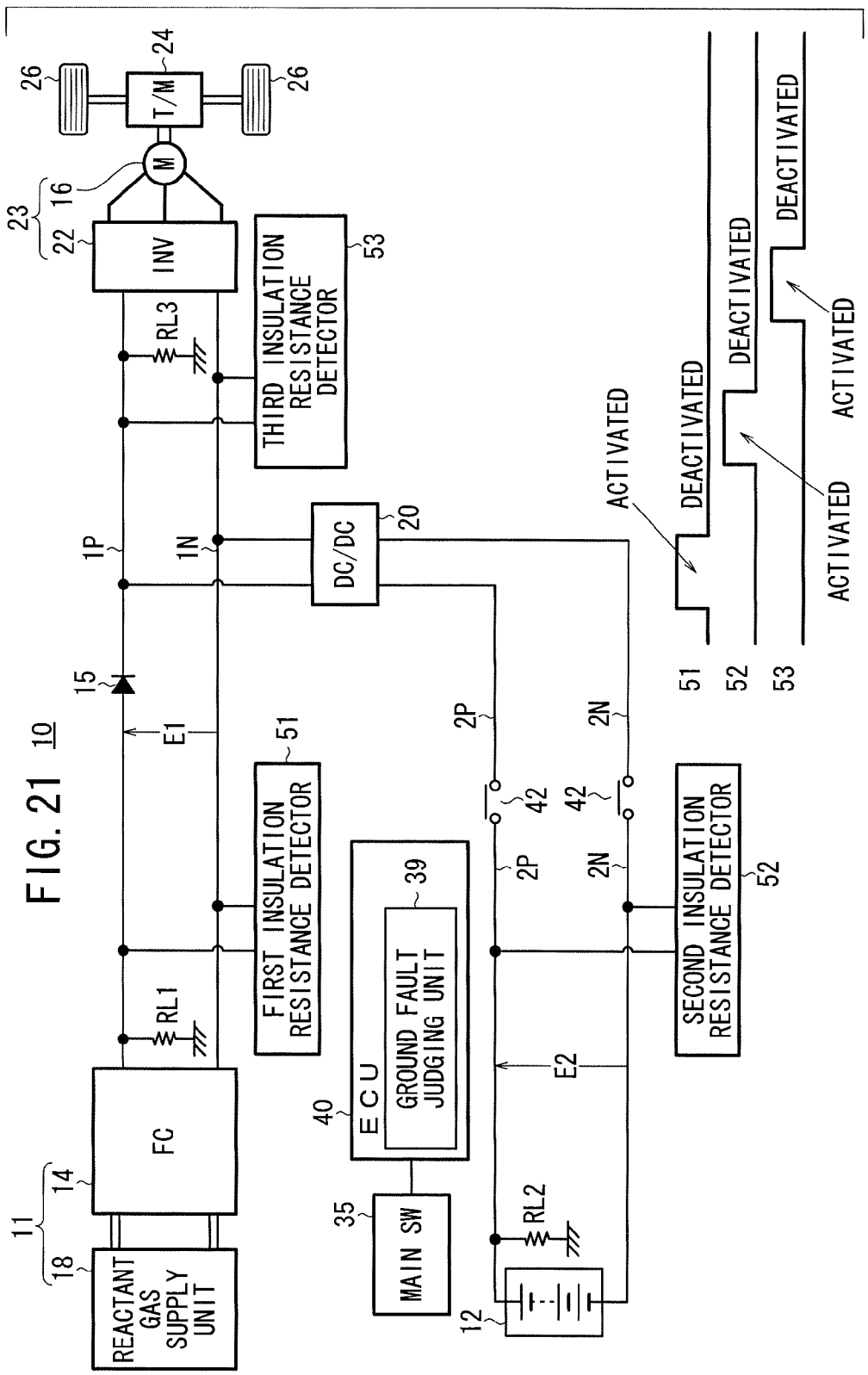

ELECTRIC VEHICLE WITH GROUND FAULT DETECTING SYSTEM

CROSS-REFERENCE TO RELATED APPLICATION

This application is based upon and claims the benefit of priority from Patent Application No. 2009-086715 filed on Mar. 31, 2009, in the Japan Patent Office, of which the contents are incorporated herein by reference.

BACKGROUND OF THE INVENTION

1. Field of the Invention

The present invention relates to an electric vehicle having a ground fault detecting system for detecting a ground fault or an insulated state of an ungrounded power supply with respect to a grounded region (ground) of the electric vehicle.

2. Description of the Related Art

Generally, electric vehicles carry a power supply having a high voltage of 200 [V] or higher, for example, which is insulated from the vehicle body as an ungrounded power supply.

A technique has been proposed for detecting a ground fault (including a ground leakage or a lowered insulation resistance value caused by deteriorated insulation) of such a high-voltage ungrounded power supply (see, for example, Japanese Laid-Open Patent Publication No. 08-226950).

According to the technique disclosed in Japanese Laid-Open Patent Publication No. 08-226950, a ground fault of a single ungrounded power supply is determined.

Nowadays, there have been proposed electric vehicles, which have a load energizable by a first ungrounded power supply, such as a fuel cell, and a second ungrounded power supply, such as an electric energy storage, e.g., a battery or the like. However, a ground fault detecting system has not been developed in the art for use on such electric vehicles that carry thereon first and second ungrounded power supplies.

SUMMARY OF THE INVENTION

An object of the present invention is to provide an electric vehicle having a ground fault detecting system, which is suitable for use on electric vehicles carrying first and second ungrounded power supplies, and which provides a high level of accuracy (detection accuracy) upon measurement of an insulation resistance value.

An electric vehicle according to the present invention incorporates therein a ground fault detecting system, which includes a load, a first ungrounded power supply having a voltage (E1) for supplying electric power to the load, a converter having input and output terminals connected between the load and the first ungrounded power supply, and a second ungrounded power supply having a voltage (E2) that is lower than the voltage of the first ungrounded power supply (E2<E1), and which is connected to other input and output terminals of the converter.

The ground fault detecting system includes a first insulation resistance detector for detecting a first insulation resistance of the first ungrounded power supply with respect to a grounded region, a second insulation resistance detector for detecting a second insulation resistance of the second ungrounded power supply with respect to the grounded region, and a ground fault judging unit for comparing the first insulation resistance or the second insulation resistance with an abnormal detection threshold value, and for judging that a ground fault has occurred if either one of the first insulation resistance and the second insulation resistance is smaller than the abnormal detection threshold value.

Since the first insulation resistance detector and the second insulation resistance detector are associated respectively with the first ungrounded power supply and the second ungrounded power supply, the first insulation resistance detector and the second insulation resistance detector can detect the first insulation resistance and the second insulation resistance with a high level of detection accuracy.

The abnormal detection threshold value comprises a first abnormal detection threshold value and a second abnormal detection threshold value to be compared respectively with the first insulation resistance and the second insulation resistance, the first abnormal detection threshold value and the second abnormal detection threshold value being set to different values such that any leakage current value is equal to a preset level. With this arrangement, ground faults of the first ungrounded power supply and the second ungrounded power supply can be detected utilizing the same leakage current.

The first insulation resistance detector and the second insulation resistance detector comprise identical circuits, respectively. The first insulation resistance detector charges a first capacitor to a charged voltage (V01) toward the voltage (E1) of the first ungrounded power supply for a first given time, discharges the first capacitor, thereafter charges the first capacitor through the first insulation resistance to a charged voltage (V11) toward the voltage (E1) of the first ungrounded power supply for a second given time, and calculates the first insulation resistance based on a ratio of the charged voltages (V01), (V11). The second insulation resistance detector charges a second capacitor to a charged voltage (V02) toward the voltage (E2) of the second ungrounded power supply for a third given time, discharges the second capacitor, thereafter charges the second capacitor through the second insulation resistance to a charged voltage (V12) toward the voltage (E2) of the second ungrounded power supply for a fourth given time, and calculates the second insulation resistance based on a ratio of the charged voltages (V02), (V12).

With this arrangement, each of the first insulation resistance detector and the second insulation resistance detector may be composed of a flying capacitor configuration.

The first insulation resistance detector and the second insulation resistance detector detect the first insulation resistance and the second insulation resistance at different times, respectively. With this arrangement, the first insulation resistance of the first ungrounded power supply and the second insulation resistance of the second ungrounded power supply can be detected reliably and accurately.

According to the present invention, the detection accuracy for detecting the insulation resistance of an electric vehicle, which includes first and second ungrounded power supplies, can be increased.

The first ungrounded power supply may comprise a fuel cell, for example, and the second ungrounded power supply may comprise an electric energy storage, for example.

The above and other objects, features, and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 21 is a block diagram of an electric vehicle incorporating a ground fault detecting system according to another embodiment of the present invention.

DESCRIPTION OF THE PREFERRED EMBODIMENTS

Electric vehicles incorporating ground fault detecting systems therein according to preferred embodiments of the present invention will be described below with reference to the drawings.

Figure 1:
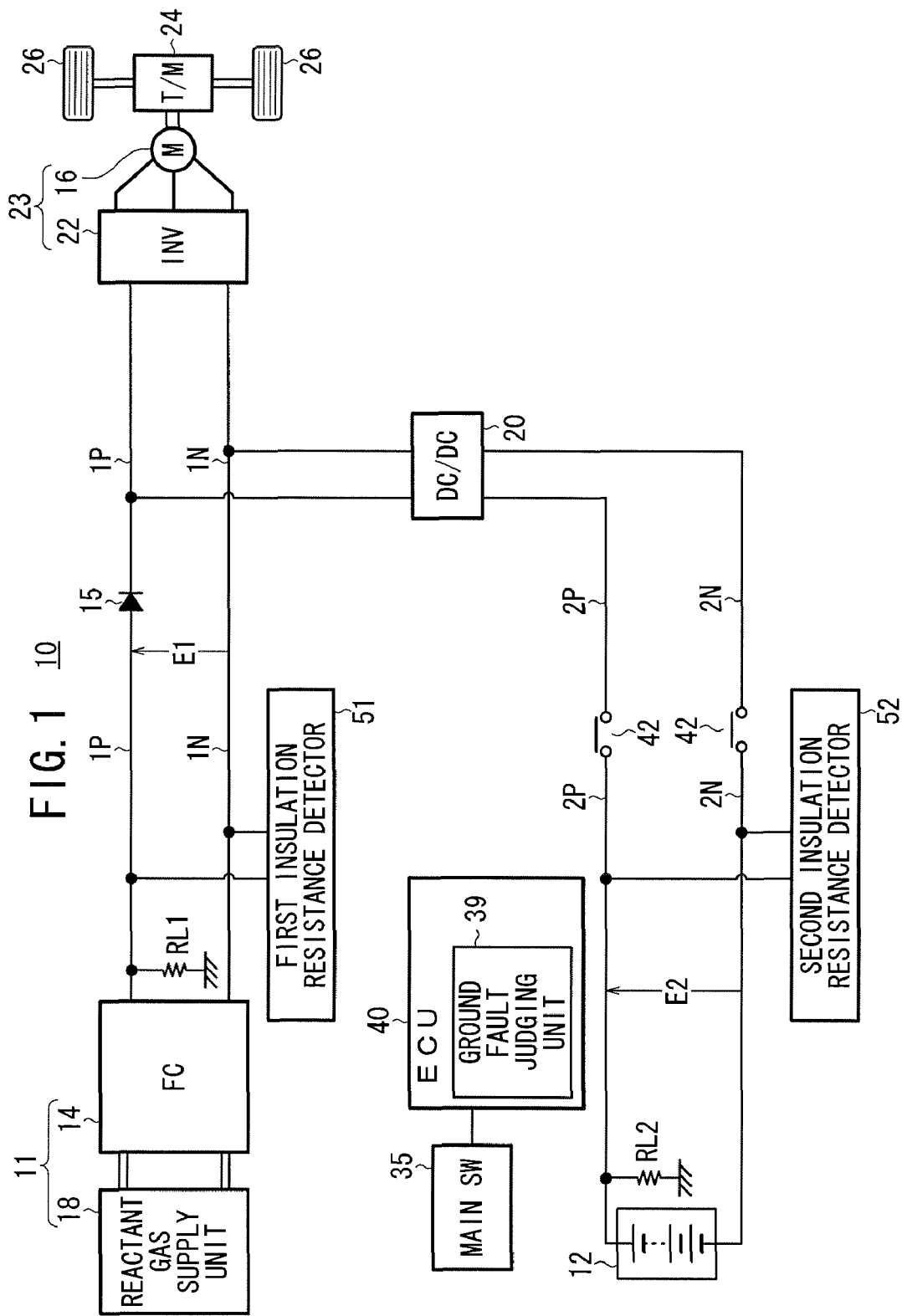
FIG. 1 is a block diagram of an electric vehicle incorporating a ground fault detecting system according to an embodiment of the present invention.

FIG. 1 shows in block form an electric vehicle 10 incorporating a ground fault detecting system according to an embodiment of the present invention.

As shown in FIG. 1, the electric vehicle 10 basically comprises a hybrid DC power supply apparatus including a fuel cell 14 (hereinafter also referred to as a "first ungrounded power supply 14"), which serves as a first ungrounded power supply (first DC power supply) for generating a voltage E1 between first main circuit lines 1P, 1N, a battery 12 (an electric energy storage, hereinafter also referred to as a "second ungrounded power supply 12"), which serves as a second ungrounded power supply (second DC power supply) for generating a voltage E2 (E1>E2) between second main circuit lines 2P, 2N, and a motor 16 for propelling the electric vehicle 10, the motor 16 being supplied with electric power from the hybrid DC power supply apparatus through an inverter 22. A diode 15 for preventing electric current from flowing into the fuel cell 14 is connected between the fuel cell 14 and the inverter 22.

The fuel cell 14 is of a stacked structure made up of a plurality of cells each comprising a solid polymer electrolyte membrane sandwiched between an anode and a cathode, which are disposed one on each side of the solid polymer electrolyte membrane. The fuel cell 14 is connected by pipes to a reactant gas supply unit 18. The reactant gas supply unit 18 includes a hydrogen tank (not shown) for storing hydrogen (fuel gas) as a reactant gas, and a compressor (not shown) for compressing air (oxygen-containing gas) as another reactant gas. When the reactant gas supply unit 18 supplies the fuel cell 14 with hydrogen and air, the reactant gases undergo an electrochemical reaction in the fuel cell 14, thereby generating an electric current that is supplied to the motor 16 and the battery 12.

The fuel cell 14 and the reactant gas supply unit 18 jointly make up a fuel cell system 11, which comprises an ECU (Electronic Control Unit) 40 (controller) for controlling the electric vehicle 10 as a whole, including the fuel cell 14 and the reactant gas supply unit 18.

A DC/DC converter 20 comprises a chopper-type voltage converter having one set of terminals connected to the battery 12 through the second main circuit lines 2P, 2N and switches 42, and another set of terminals connected to the fuel cell 14 and the motor 16 through the first main circuit lines 1P, 1N.

Figure 2:
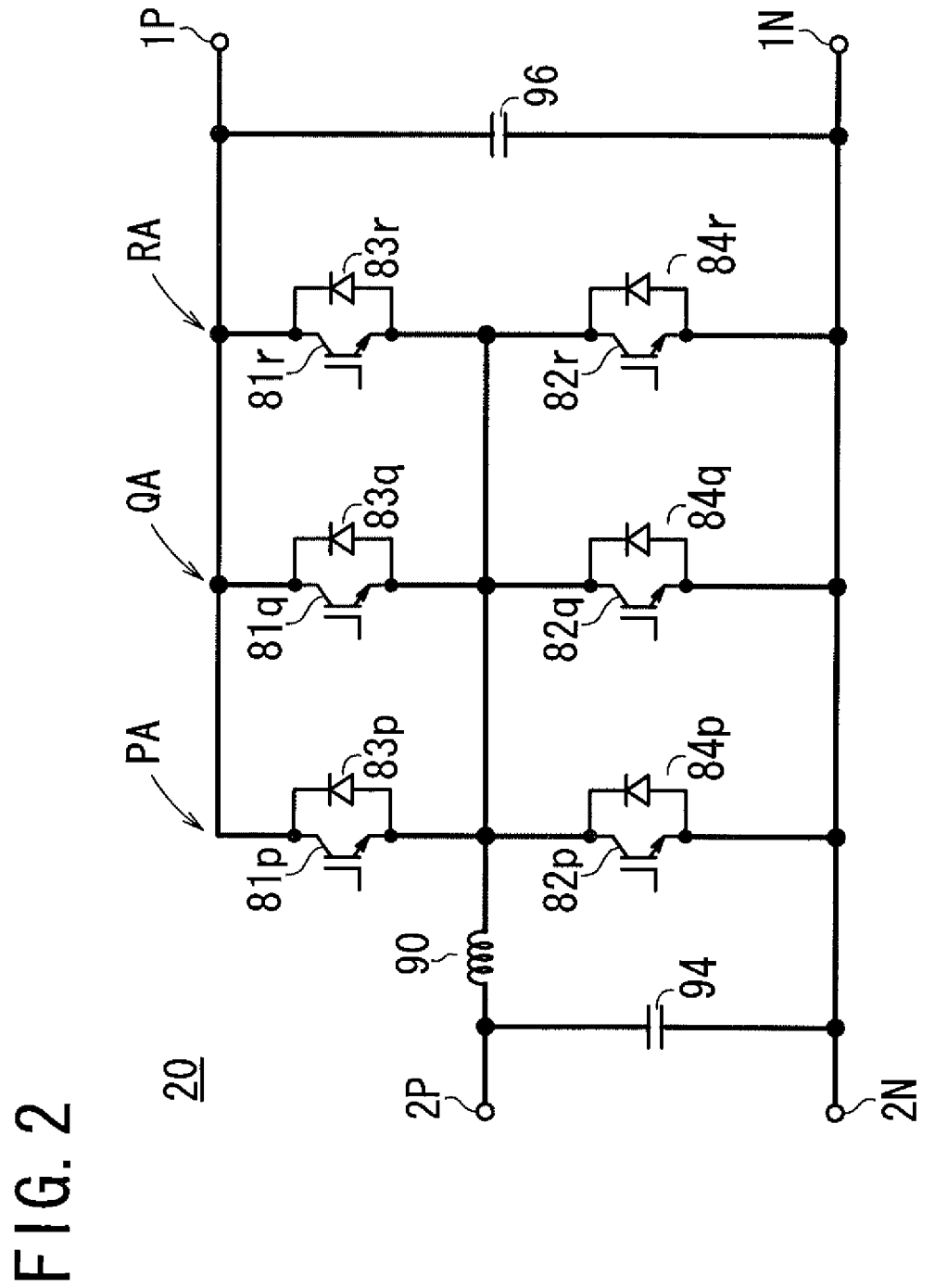
FIG. 2 is a circuit diagram of a DC/DC converter of the electric vehicle.

FIG. 2 is a circuit diagram of the DC/DC converter 20.

As shown in FIG. 2, the DC/DC converter 20 serves as a buck-boost converter for converting (increasing) the voltage E2 of the battery 12 to the voltage E1 (E2<E1) of the fuel cell 14, and for converting (reducing) the voltage E1 of the fuel cell 14 to the voltage E2 of the battery 12.

The DC/DC converter 20 comprises three-phase phase arms PA, QA, RA energizable by the ECU 40, and a reactor 90.

The P-phase arm PA comprises upper arm elements (an upper arm switching element 81p and a diode 83p) and lower arm elements (a lower arm switching element 82p and a diode 84p).

The Q-phase arm QA comprises upper arm elements (an upper arm switching element 81q and a diode 83q) and lower arm elements (a lower arm switching element 82q and a diode 84q).

The R-phase arm RA comprises upper arm elements (an upper arm switching element 81r and a diode 83r) and lower arm elements (a lower arm switching element 82r and a diode 84r).

The upper arm switching elements 81p, 81q, 81r and the lower arm switching elements 82p, 82q, 82r may comprise MOSFETs, IGBTs, or the like, respectively, for example.

The reactor 90 is inserted between midpoints (common junctions) of the phase arms PA, QA, RA and the positive terminal of the battery 12. The reactor 90 discharges and stores energy when the DC/DC converter 20 converts between the voltage E2 and the voltage E1.

Smoothing capacitors 94, 96 are connected between the second main circuit lines 2P, 2N and the first main circuit lines 1P, 1N, respectively.

The arm switching elements 81p, 81q, 81r, 82p, 82q, 82r are selectively turned on and off by levels of gate drive signals (drive voltages), which are supplied from the ECU 40. The DC/DC converter 20 operates in an alternate three-phase arm drive mode, or in a simultaneous all-phase arm drive mode.

Figure 3:
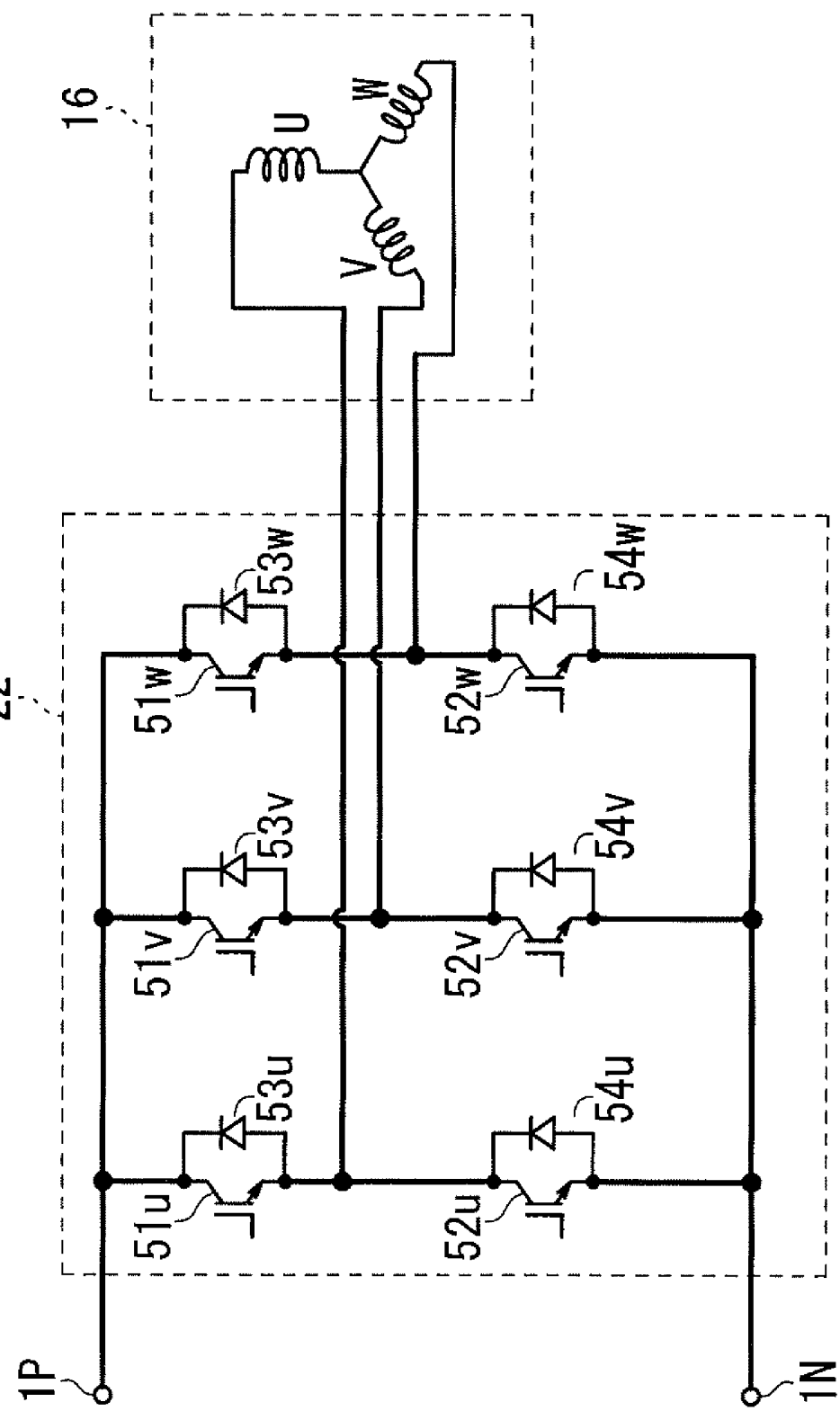
FIG. 3 is a circuit diagram of an inverter of the electric vehicle.

FIG. 3 is a circuit diagram of the inverter 22. As shown in FIG. 3, the inverter 22, which is of a three-phase full-bridge configuration, performs AC/DC conversions. More specifically, the inverter 22 converts a direct current DC from the hybrid DC power supply apparatus into a three-phase alternating current AC, and supplies the three-phase alternating current AC to the U-phase coil, V-phase coil, and W-phase coil of the motor 16. The inverter 22 also converts a three-phase alternating current AC generated by the motor 16 in a regenerative mode into a direct current DC, and supplies the direct current DC from the first main circuit lines 1P, 1N through the DC/DC converter 20 to the second main circuit lines 2P, 2N in order to charge the battery 12.

The inverter 22 comprises switching elements 51u, 51v, 51w, 52u, 52v, 52w, which comprise MOSFETs, IGBTs, or the like, respectively, that are energizable by the ECU 40, and diodes 53u, 53v, 53w, 54u, 54v, 54w, which are reverse-connected across the switching elements 51u, 51v, 51w, 52u, 52v, 52w, respectively.

As shown in FIG. 1, when energized, the motor 16 causes a transmission 24 to rotate the wheels 26 of the electric vehicle 10. The inverter 22 and the motor 16 are collectively referred to as a load 23.

The high-voltage battery 12, which is connected between the second main circuit lines 2P, 2N through the switches 42, is a high-voltage battery serving as an electric energy storage, which may comprise a lithium ion secondary cell, a capacitor, or the like. In the present embodiment, the battery 12 comprises a lithium ion secondary cell.

The ECU 40 comprises a microcomputer or the like for generally controlling the electric vehicle 10 in its entirety including the fuel cell system 11, the switches 42, the DC/DC converter 20, the load 23, and first and second ground fault detectors 51, 52 to be described later. A main switch (power supply switch) 35 is connected to the ECU 40. The main switch 35 serves as an ignition switch for turning on (activating or starting) and turning off (deactivating) the electric vehicle 10 and the fuel cell system 11.

A first insulation resistance detector 51 for detecting a ground fault of the fuel cell 14, the inverter 22, and the motor 16 that are connected to the first main circuit lines 1P, 1N based on the value of a first insulation resistor RL1 is connected between the first main circuit lines 1P, 1N. A second insulation resistance detector 52 for detecting a ground fault of the battery 12 that is connected to the second main circuit lines 2P, 2N based on the value of a second insulation resistor RL2 is connected between the second main circuit lines 2P, 2N.

The ECU 40 includes a ground fault judging unit 39 (comparing unit) as a functional means thereof. The first and second insulation resistance detectors 51, 52 and the ECU 40 together with the ground fault judging unit 39 collectively make up the ground fault detecting system according to the present embodiment.

Figure 4:
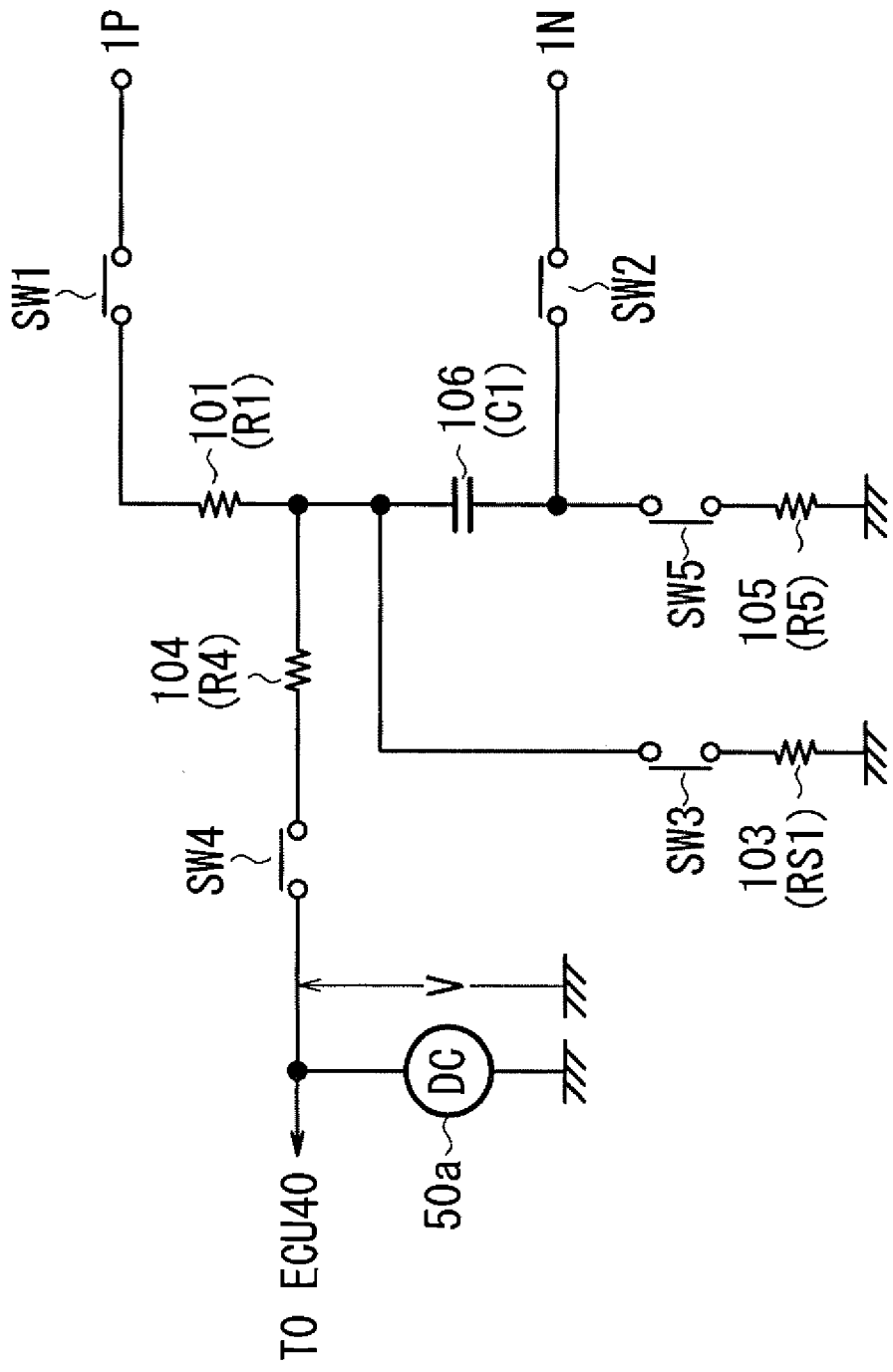
FIG. 4 is a circuit diagram of a first insulation resistance detector of the ground fault detecting system.
Figure 5:
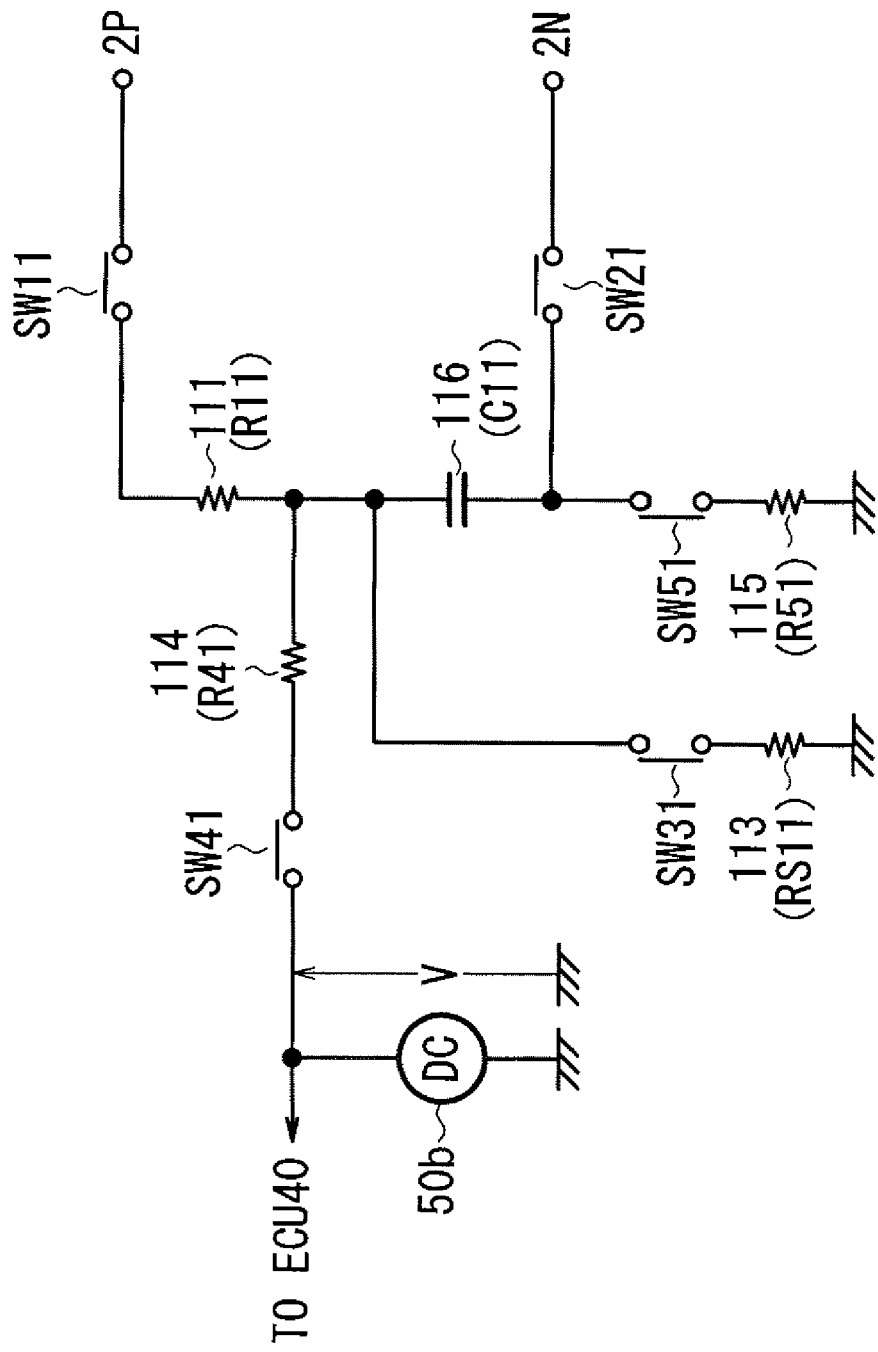
FIG. 5 is a circuit diagram of a second insulation resistance detector of the ground fault detecting system.

FIG. 4 is a circuit diagram of the first insulation resistance detector 51, and FIG. 5 is a circuit diagram of the second insulation resistance detector 52. The first and second insulation resistance detectors 51, 52 have identical circuit arrangements.

As shown in FIG. 4, a switch SW1 and a switch SW2 have respective ends, which are connected to the first main circuit lines 1P, 1N, respectively. The switch SW1 has another end connected to an end of a resistor 101 having a resistance value R1. The resistor 101 has another end connected to an end of a resistor 104 having a resistance value R4. The other end of the resistor 101 also is connected to an end of a switch SW3, and to an end of a capacitor 106 having a capacitance C1.

The resistor 104 has another end connected through a switch SW4 to a voltage sensor (voltmeter) 50a, which measures a voltage value (voltage) V between the resistor 104 and ground (vehicle body, vehicle ground). The detected voltage value V is read by the ECU 40 and stored in a memory of the ECU 40. The switch SW3 has another end connected to ground through a resistor 103 having a resistance value RS1.

The capacitor 106 has another end connected to another end of the switch SW2, and also connected to ground through a switch SW5 and a resistor 105 having a resistance value R5.

Similarly, as shown in FIG. 5, a switch SW11 and a switch SW21 have respective ends connected to the second main circuit lines 2P, 2N, respectively. The switch SW11 has another end connected to an end of a resistor 111 having a resistance value R11. The resistor 111 has another end connected to an end of a resistor 114 having a resistance value R41. The resistor 111 also is connected to an end of a switch SW31, and to an end of a capacitor 116 having a capacitance C11.

The resistor 114 has another end connected through a switch SW41 to a voltage sensor (voltmeter) 50b, which measures a voltage value (voltage) V between the resistor 114 and ground (vehicle body, vehicle ground). The detected voltage value V is read by the ECU 40 and stored in the memory of the ECU 40. The switch SW31 has another end connected to ground through a resistor 113 having a resistance value RS11.

The capacitor 116 has another end connected to another end of the switch SW21, and also connected to ground through a switch SW51 and to a resistor 115 having a resistance value R51.

The switches SW1 through SW4 and SW11 through SW51 are opened and closed at times controlled by the ECU 40, which functions as a switch opening/closing timing controller.

The ground fault detecting system incorporated in the electric vehicle 10 is basically constructed as described above. Operation of the ground fault detecting system for detecting a ground fault in the electric vehicle 10 will be described below while taking into consideration the following topics A, B, C:

A. Principles of measurement (detection) of an insulation resistance utilizing the first and second ground fault detectors 51, 52;

B. Problems that occur if only the first ground fault detector 51 is present while the second ground fault detector 52 is not; and C. Operation of the ground fault detecting system utilizing both the first and second ground fault detectors 51 and 52.

First, topic A, concerning principles of measurement (detection) of an insulation resistance with the first and second ground fault detectors 51, 52, e.g., principles of measurement utilizing the first ground fault detector 51, will be described below.

Figure 6:
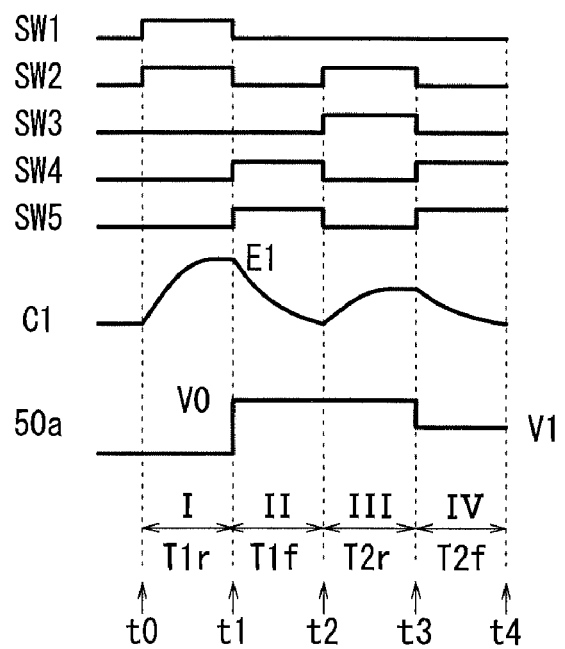
FIG. 6 is a timing chart illustrative of the principles of measurement of an insulation resistance value.
Figure 7:
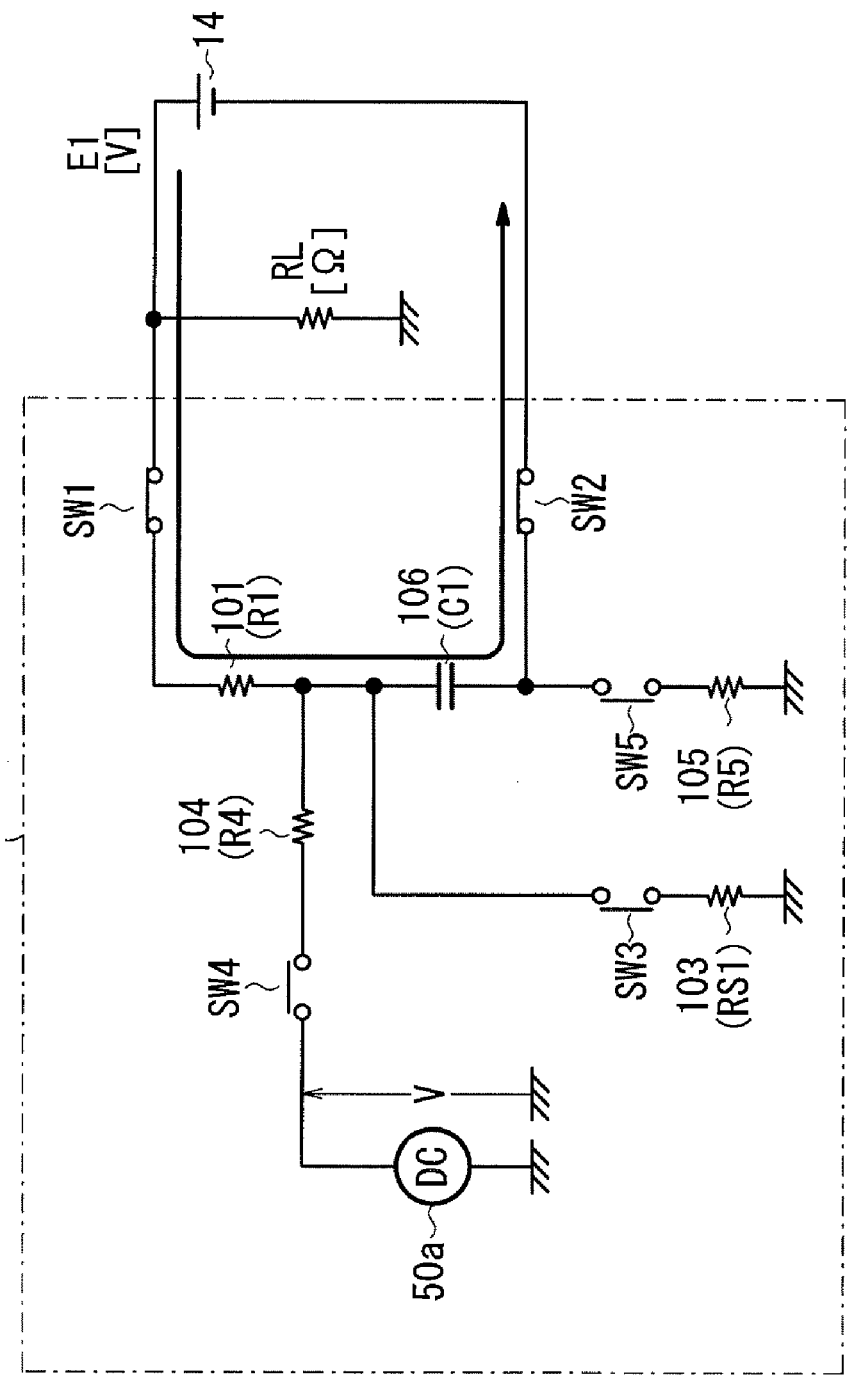
FIG. 7 is a circuit diagram of the first insulation resistance detector, showing operation thereof during a power supply voltage measurement period (charging period)

FIG. 6 shows a timing chart illustrative of the principles of measurement of an insulation resistor RL having a resistance value also referred to as RL [Ω] (see FIG. 7). In FIG. 7, the insulation resistor RL is connected between the vehicle body (ground) and a positive terminal of the first ungrounded power supply 14. The insulation resistor RL corresponds to the insulation resistor RL1 shown in FIG. 1. During a first rise time (first given time) T1r from time t0 to time t1, which is referred to as "I: POWER SUPPLY VOLTAGE MEASUREMENT PERIOD", as shown in FIG. 7, the switches SW1, SW2 are closed, thereby charging the capacitor 106 to a voltage V0 toward the voltage E1 [V] of the first ungrounded power supply 14, according to the following equation (1):

$$V0 = E1[1 - \exp\{-(T1r/(R1 \times C1))\}] \tag{1}$$

Figure 8:
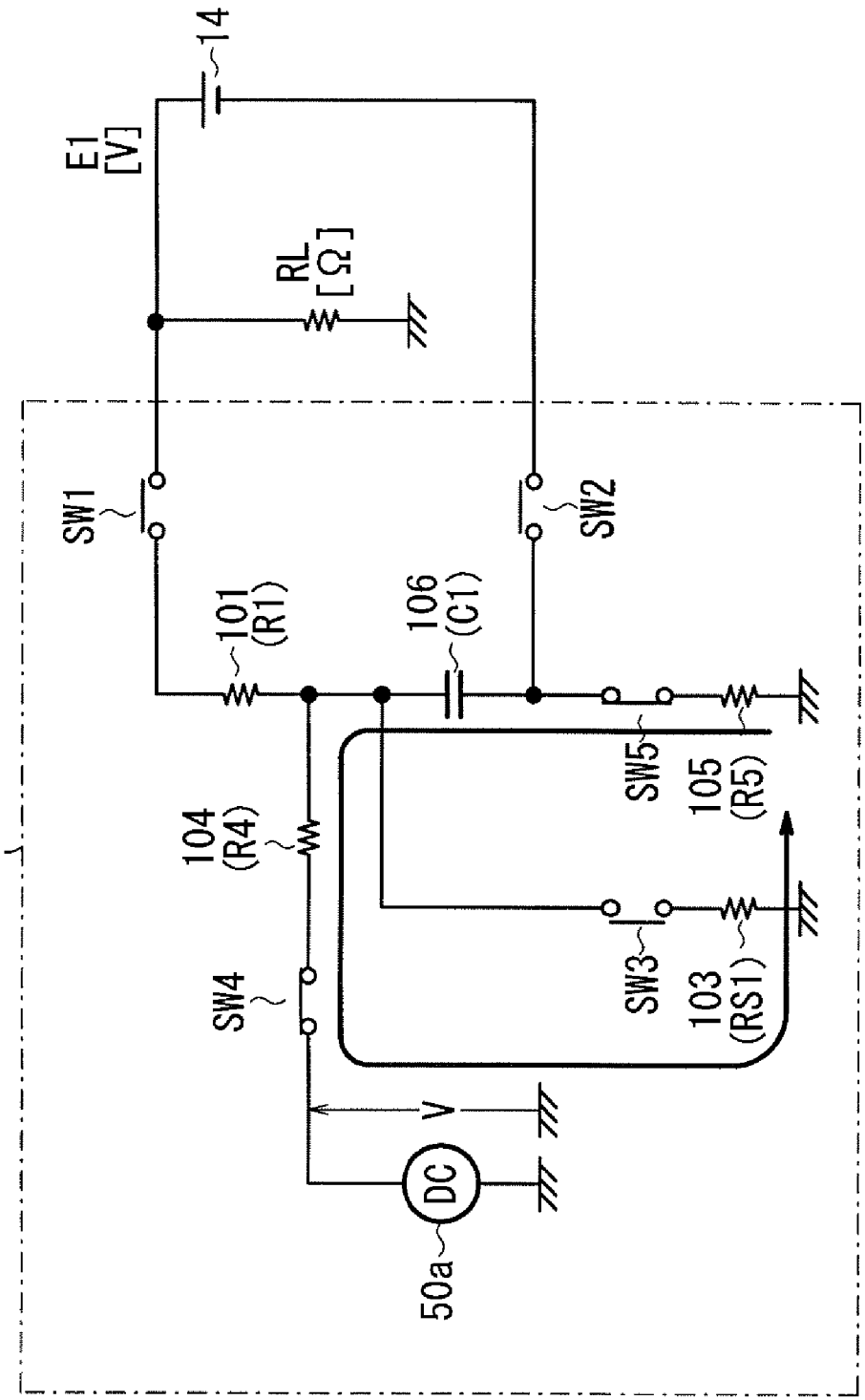
FIG. 8 is a circuit diagram of the first insulation resistance detector, showing operation thereof during a capacitor voltage reading and discharging period.

At time t1, as shown in FIG. 8, the switches SW1, SW2 are opened while the switches SW4, SW5 are closed, thereby allowing the voltage sensor 50a to measure the voltage V0 and store the voltage v0 in the memory of the ECU 40. The ECU 40 and the voltage sensor 50a operate as a peak hold circuit during a period from time t1 to time t2, which is referred to as "II: CAPACITOR VOLTAGE READING AND DISCHARGING PERIOD". The electric energy stored in the capacitor 106 is discharged through the internal resistance of the voltage sensor 50a, along a path indicated by the arrow in FIG. 8.

From time t0 to time t2, the capacitor 106 is charged without being affected by the insulation resistor RL.

Figure 9:
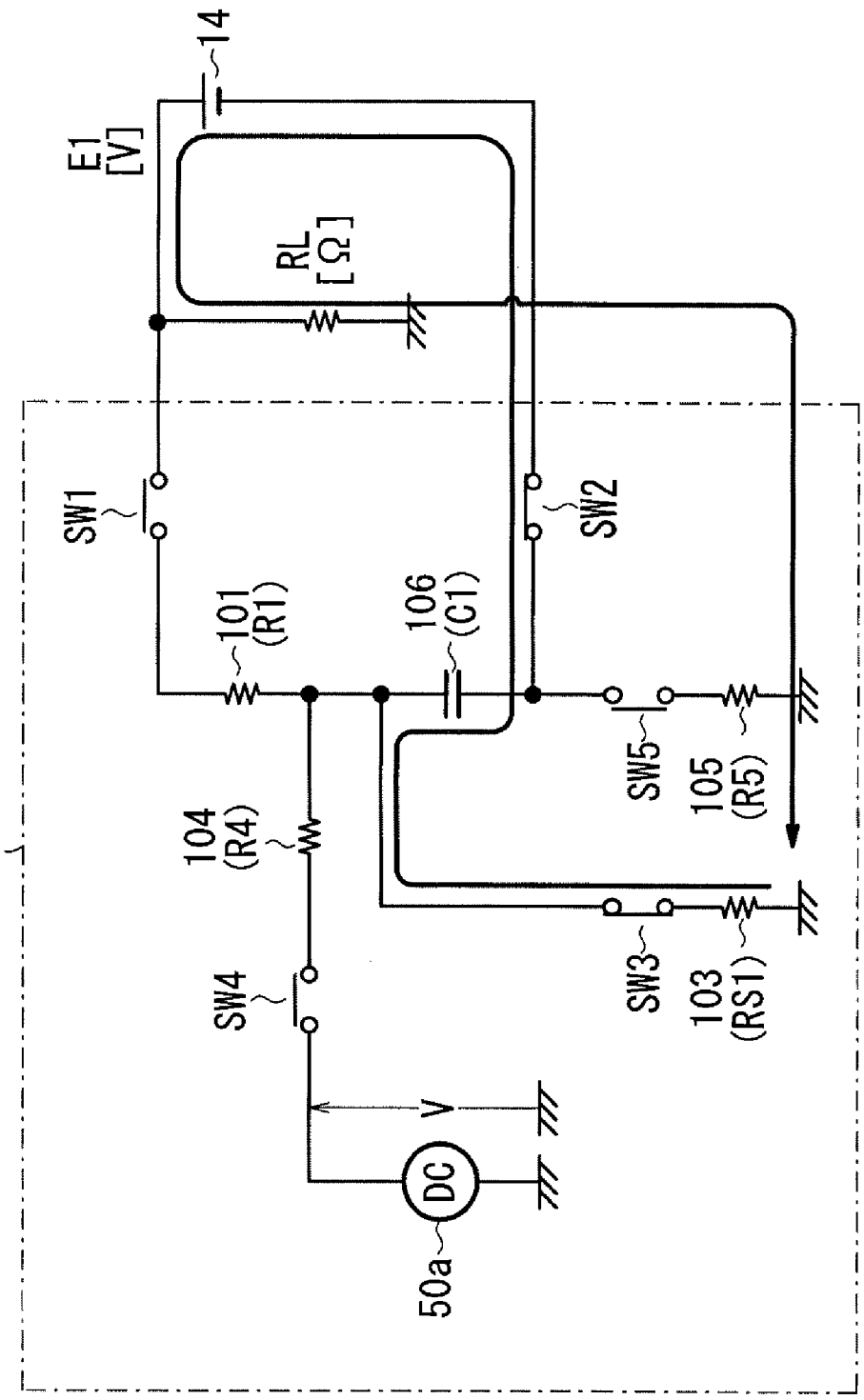
FIG. 9 is a circuit diagram of the first insulation resistance detector, showing operation thereof during a positive-side ground fault measurement period (charging period)

During a second rise time (second given time) T2r from time t2 to time t3, which is referred to as "III: POSITIVE-SIDE GROUND FAULT MEASURING PERIOD", the switches SW2, SW3 are closed as shown in FIG. 9. At this time, an electric current flows from the positive terminal of the first ungrounded power supply 14, via the resistor 103, the insulation resistor RL, the switch SW3, the capacitor 106, and the switch SW2, to the negative terminal of the first ungrounded power supply 14, thereby charging the capacitor 106 to a voltage V1 toward the voltage E1 [V] of the first ungrounded power supply 14, according to the following equation (2):

$$V1 = E1[1 - \exp\{-(T2r/((RL+RS1) \times C1))\}] \tag{2}$$

At time t3, the switches SW1, SW2 are opened and the switches SW4, SW5 are closed in order to provide the circuit shown in FIG. 8, thereby allowing the voltage sensor 50a to measure the voltage V1 and store the voltage V1 in the memory of the ECU 40. The ECU 40 and the voltage sensor 50a operate as a peak hold circuit during the period from time t3 to time t4, which is referred to as "IV: CAPACITOR VOLTAGE READING AND DISCHARGING PERIOD". During this time, the capacitor 106 operates as a flying capacitor.

Figure 10:
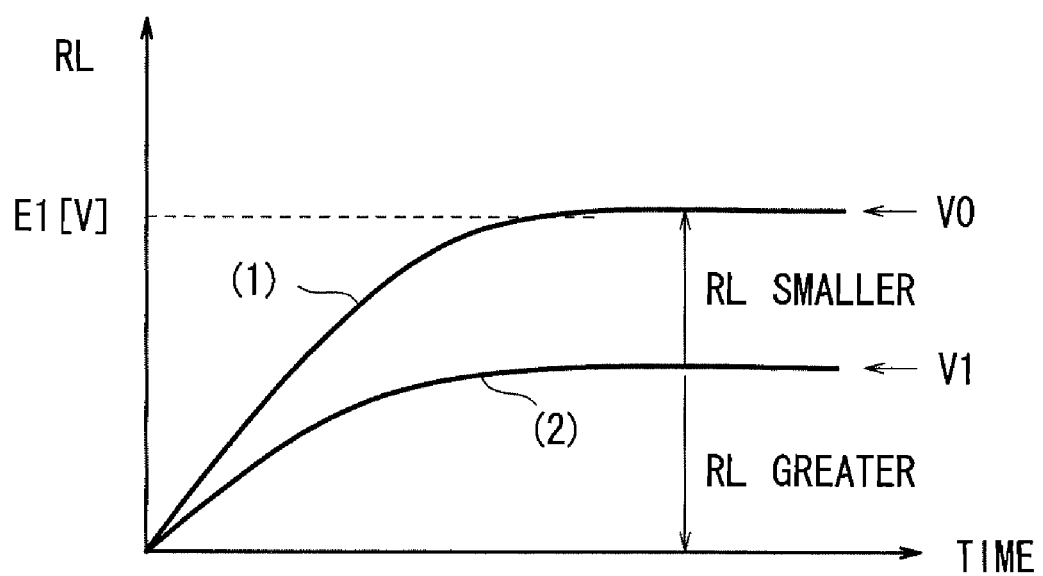
FIG. 10 is a graph showing how charged voltages change within a given period of time, depending on the magnitude of an insulation resistance value.

FIG. 10 shows how the charged voltages V0, V1 change within a given period of time, depending on the magnitude of the insulation resistance value RL. As shown in FIG. 10, since as indicated by equation (2) a current limiting resistor is represented by RL+RS1, as the insulation resistance value RL becomes greater, the time constant also becomes greater, and the charged voltage V1 during the second given time T2r is made smaller. Conversely, as the insulation resistance value RL becomes smaller, the charged voltage V1 during the second given time T2r approaches the voltage E1 of the first ungrounded power supply 14.

Figure 11:
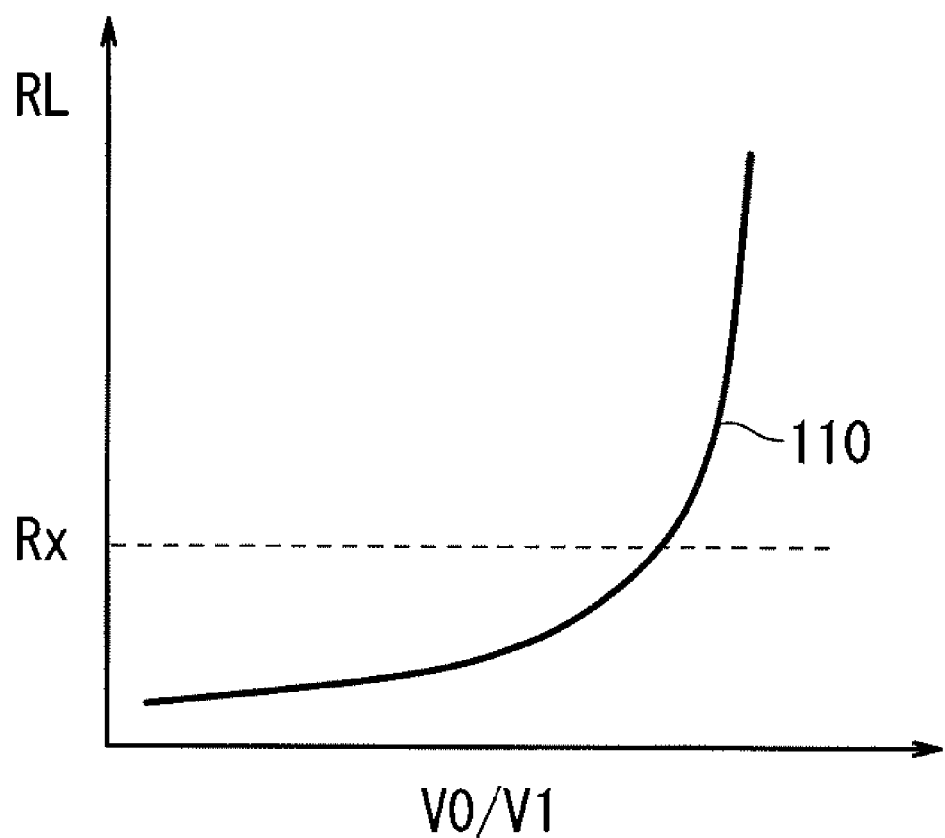
FIG. 11 is a graph showing the relationship between a voltage ratio and an insulation resistance value.

As indicated by the characteristic curve 110 shown in FIG. 11, which represents the relationship between a voltage ratio between the voltages V0, V1 (V0/V1) and the insulation resistance value RL, the insulation resistance value RL can be determined from the voltage ratio V0/V1.

Figure 12:
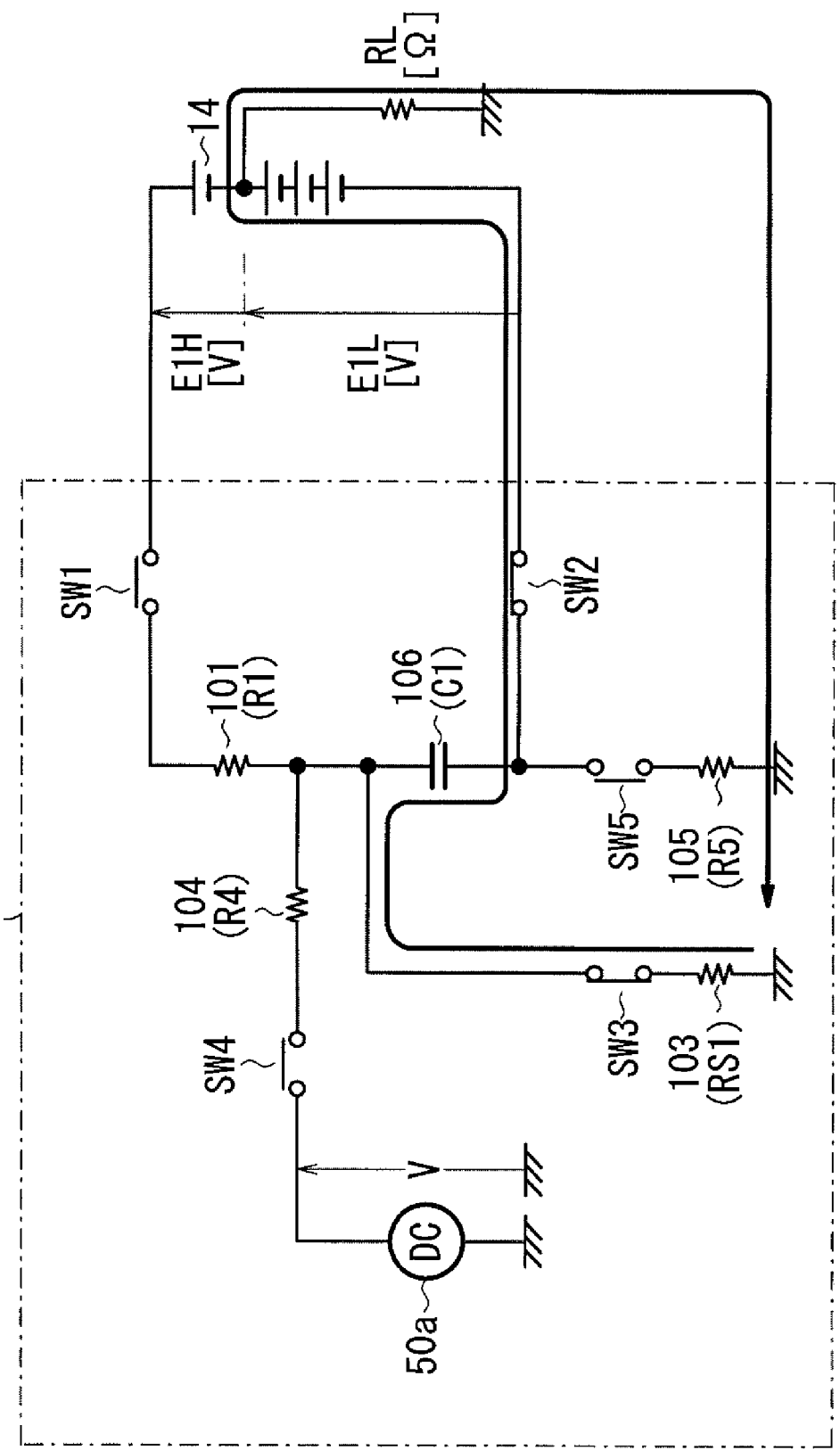
FIG. 12 is a circuit diagram of the first insulation resistance detector, showing operation thereof when a ground fault occurs in a first ungrounded power supply.

A ground fault may occur at the positive terminal of the first ungrounded power supply 14, or somewhere within the first ungrounded power supply 14, i.e., at either one of the stacked cells, i.e., the series-connected cells of the fuel cell 14. In the latter case, the error can be canceled out by detecting an insulation resistance value at the negative terminal of the fuel cell 14, as disclosed in Japanese Laid-Open Patent Publication No. 08-226950. More specifically, assuming as shown in FIG. 12 that a voltage from the negative terminal of the fuel cell 14 to a ground fault spot in the fuel cell 14 is indicated by E1L, and that a voltage from the ground fault spot to the positive terminal of the fuel cell 14 is indicated by E1H, then the error can be canceled out because E1L+E1H=E1. For example, as shown in FIG. 12, the voltage V1 across the capacitor 106 at a time when the switches SW2, SW3 are closed is determined by the following equation (3):

$$V1 = E1L[1 - \exp\{-(T2r/((RL+RS1) \times C1))\}] \tag{3}$$

The ground fault judging unit 39 of the ECU 40 compares the measured insulation resistance value RL with an abnormal detection threshold value Rx [Ω]. If the insulation resistance value RL is smaller than the abnormal detection threshold value Rx (RL<Rx), then the ground fault judging unit 39 judges that a ground fault has occurred, and issues an alarm. The abnormal detection threshold value Rx represents an insulation resistance threshold value beyond which any ground leakage current is lower than a preset safety level.

Topic B, concerning problems that occur if only the first ground fault detector 51 is present while the second ground fault detector 52 is not present, will be described below.

Figure 13:
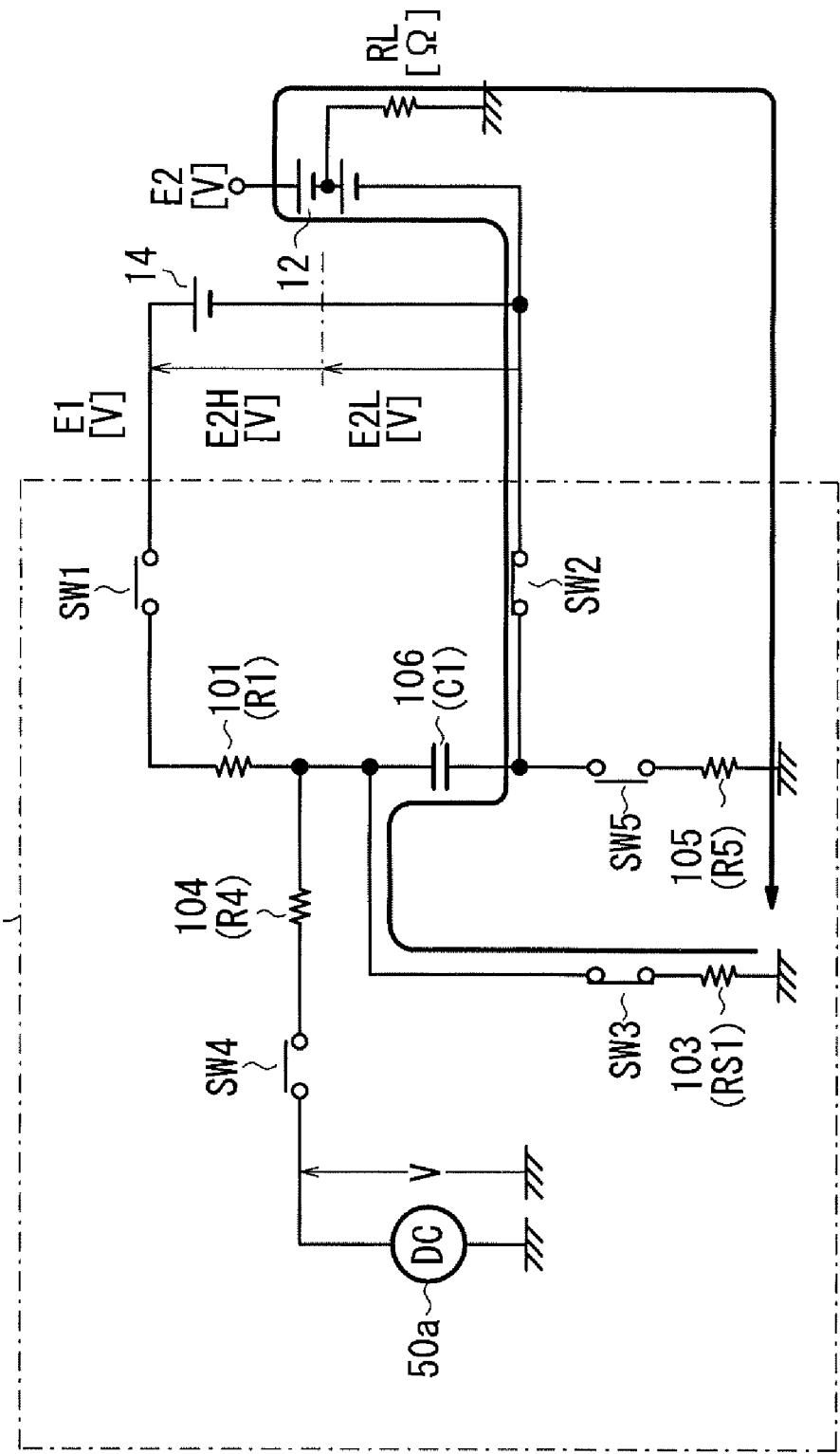
FIG. 13 is a circuit diagram of the first insulation resistance detector, showing operation thereof when a ground fault occurs in a second ungrounded power supply.

As shown in FIG. 13, assuming that only the first ground fault detector 51 is present, when a ground fault occurs somewhere in the second ungrounded power supply 12, the insulation resistance value thereof is lowered. If the timing chart shown in FIG. 6 is applied to detect the insulation resistance value RL of the first ungrounded power supply 14, then the circuit is constructed as shown in FIG. 7, and the voltage V0 is measured according to equation (1).

Then, when the circuit is constructed as shown in FIG. 9 (FIG. 13) in order to detect the insulation resistance value RL of the first ungrounded power supply 14, since the second ungrounded power supply 12 actually suffers from a ground fault, electric current flows along the path indicated by the arrow in FIG. 13, and the voltage V1 is determined according to the following equation (4):

$$V1 = E2L[1 - \exp\{-(T2r/((RL+RS1) \times C1))\}] \tag{4}$$

Assuming that a voltage from the ground fault spot to the positive terminal of the first ungrounded power supply 14 is represented by E2H, then since E2H+E2L=E1, errors cannot be eliminated even according to the technique disclosed in Japanese Laid-Open Patent Publication No. 08-226950.

Figure 14:
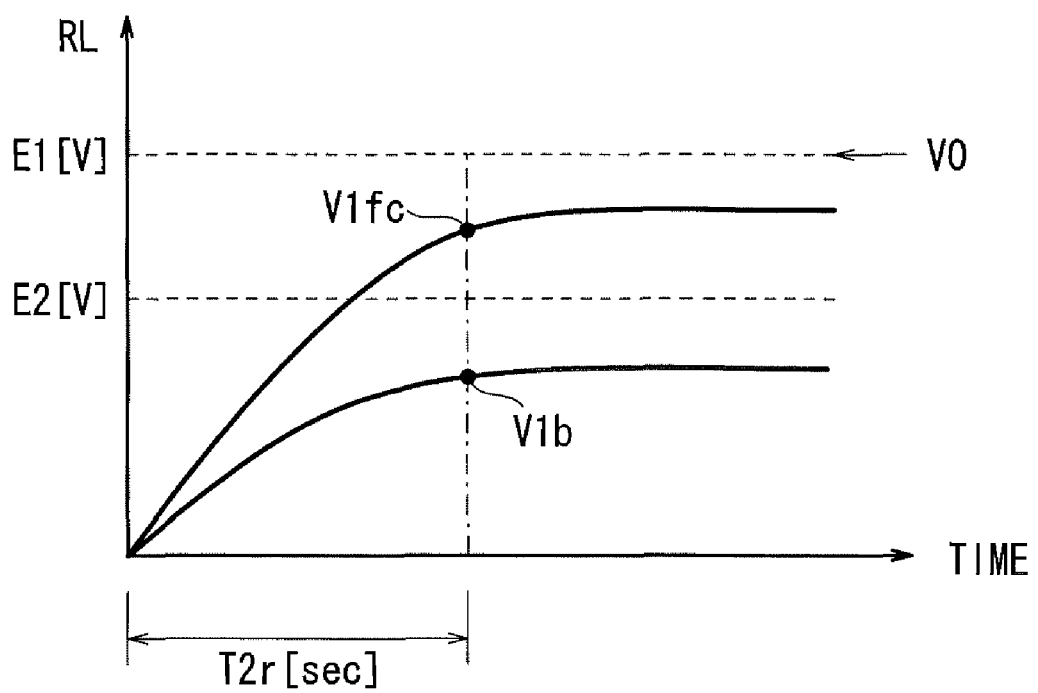
FIG. 14 is a graph showing a charging time with respect to different power supplies, which suffer from ground faults.

More specifically, as shown in FIG. 14, even with the same insulation resistance value RL, the voltage V1 is measured as a different value when a ground fault occurs in association with the first ungrounded power supply 14 having the voltage E1 than when a ground fault occurs in association with the second ungrounded power supply 12 having the voltage E2 (E2<E1). Stated otherwise, if only the first ground fault detector 51 is present and used, then since the insulation resistance value is measured with respect to the voltage E1, when a ground fault (insulation resistance value RL) occurs in association with the second ungrounded power supply 12 having the voltage E2, the charged voltage reached in the second given time T2r is represented by V1b, which is lower than the charged voltage V1fc reached in the second given time T2r when a ground fault (insulation resistance value RL) occurs in association with the first ungrounded power supply 14 having the voltage E1. In other words, when a ground fault (insulation resistance value RL) occurs in association with the second ungrounded power supply 12 having the voltage E2, the insulation resistance value RL is read as a higher value because the rise time is longer.

Figure 15:
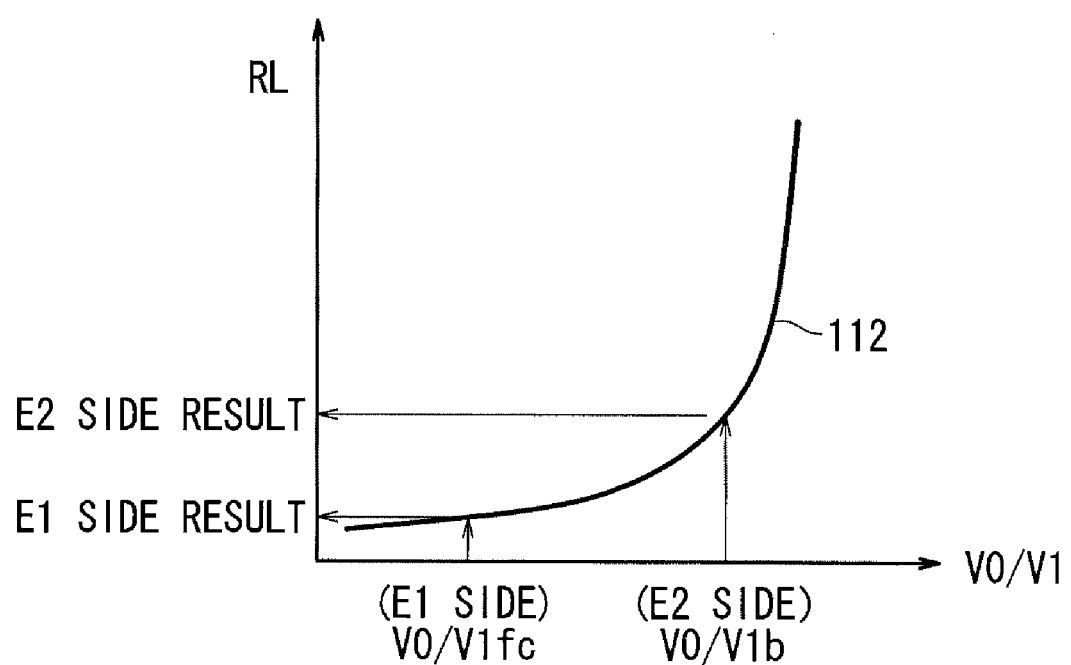
FIG. 15 is a graph showing insulation resistance values read with respect to different power supplies, which suffer from ground faults.

The above problem will be described with reference to FIG. 15, which shows a characteristic curve 112 representative of the relationship between the insulation resistance value RL and the voltage ratio V0/V1. If only the first ground fault detector 51 is used to measure the insulation resistance value RL with respect to the voltage E1, then when a ground fault (insulation resistance value RL) occurs in association with the second ungrounded power supply 12 having the voltage E2, then the voltage ratio V0/V1=V0/V1$b$ becomes higher, and the insulation resistance value RL is read as a higher value. When a ground fault occurs in association with the first ungrounded power supply 14 having the voltage E1, then the voltage ratio V0/V1=V0/V1$fc$ becomes smaller, allowing the insulation resistance value RL to be read with higher accuracy.

Figure 16:
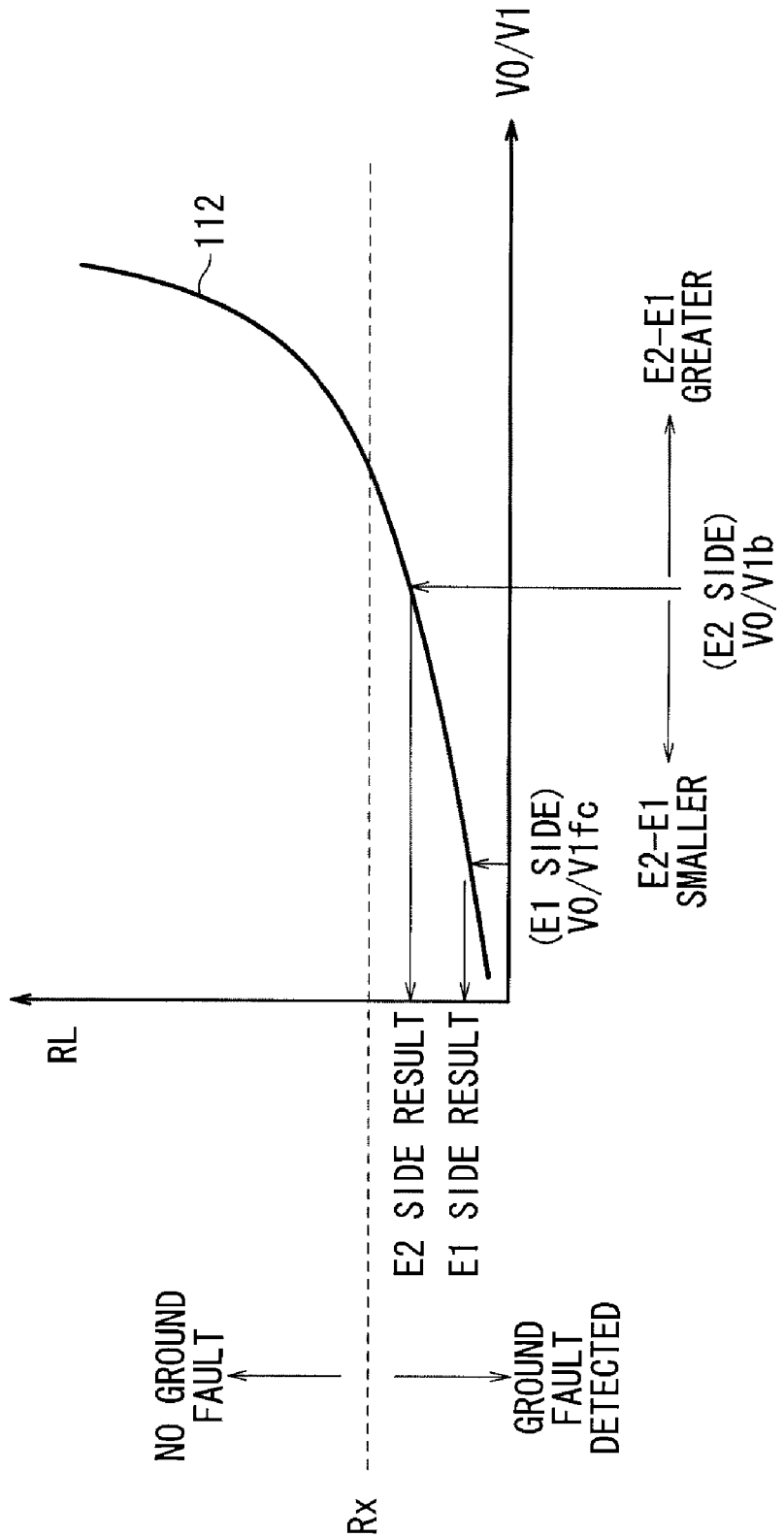
FIG. 16 is a graph showing an example in which a ground fault resistance can be detected, assuming that a difference between voltages of the first ungrounded power supply and the second ungrounded power supply is small.
Figure 17:
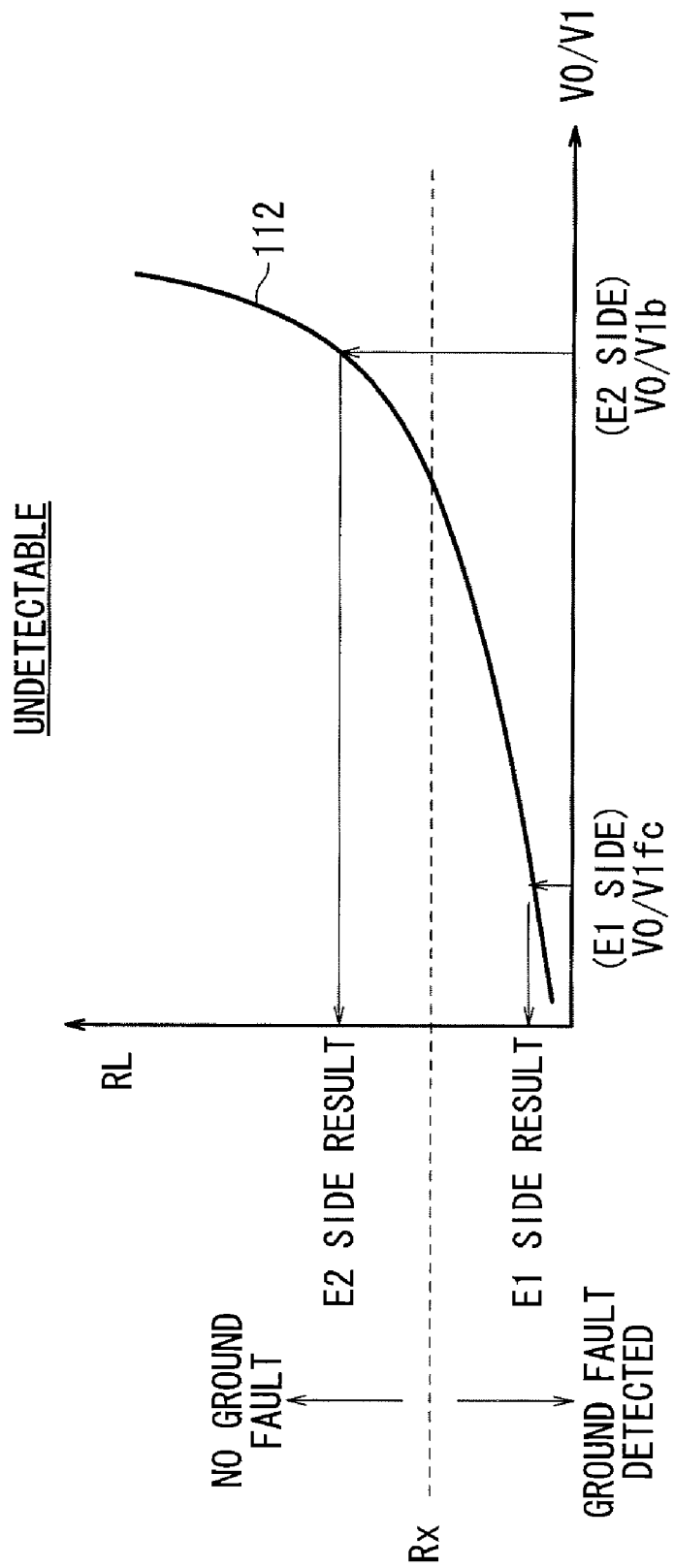
FIG. 17 is a graph showing an example in which a ground fault resistance cannot be detected, assuming that a difference between voltages of the first ungrounded power supply and the second ungrounded power supply is large.
Figure 18:
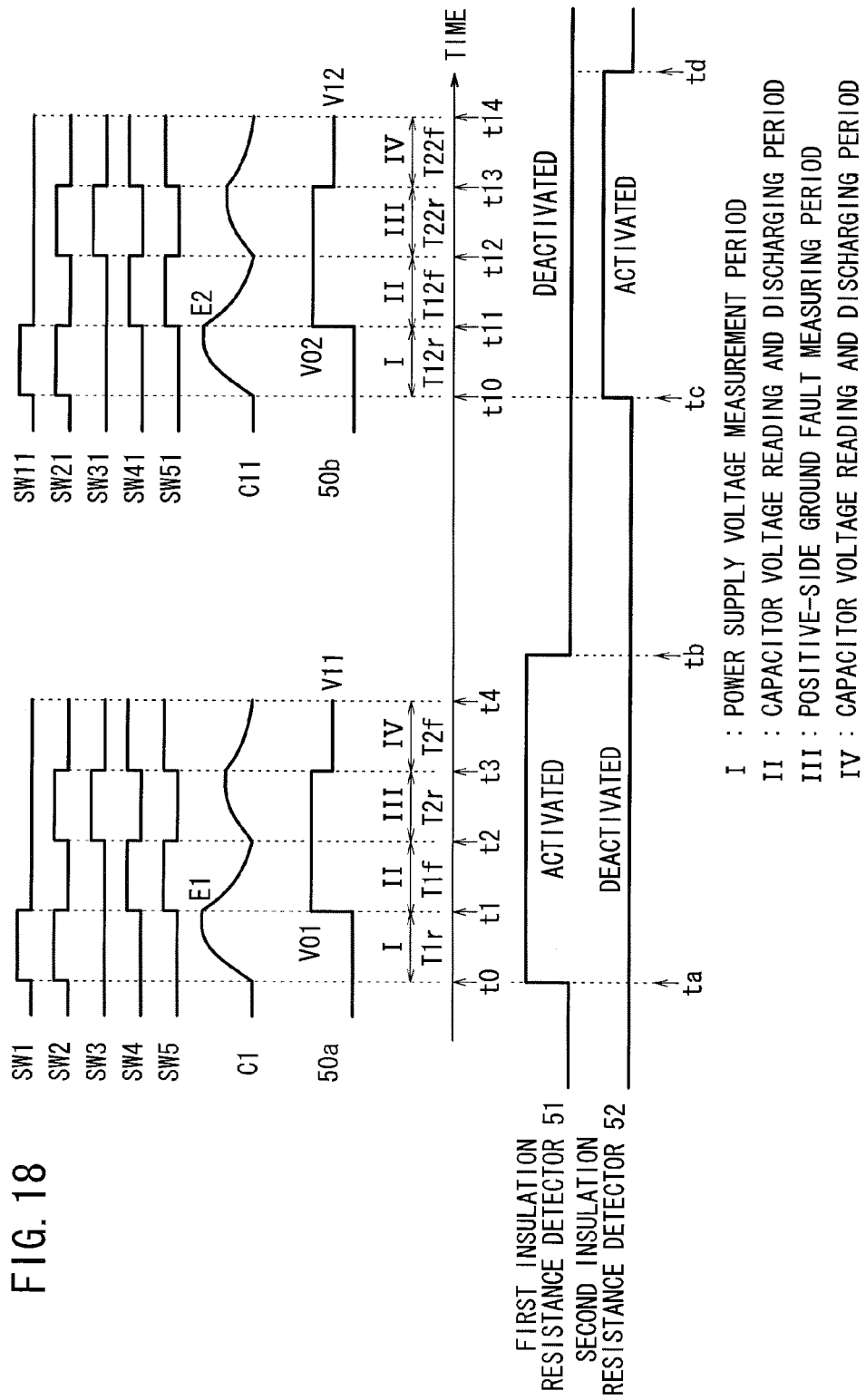
FIG. 18 is a timing chart showing an operation sequence of the ground fault detecting system.

The above tendency is manifested more as the difference between the voltage E1 and the voltage E2 becomes greater. If the difference ΔV(E1−E2) is small as shown in FIG. 16, then a ground fault can be detected by comparing the insulation resistance values RL, in association with the first and second ungrounded power supplies 14, 12 having the voltages E1, E2, with the abnormal detection threshold value Rx. However, if the difference ΔV(E1−E2) is large as shown in FIG. 17, then a ground fault cannot be detected by comparing the insulation resistance values RL, in association with the first and second ungrounded power supplies 14, 12 having the voltages E1, E2, with the abnormal detection threshold value Rx.

Topic C, concerning operation of the ground fault detecting system with both the first and second ground fault detectors 51, 52 being present, will be described below with reference to FIGS. 1 and 8.

The ECU 40 outputs an operation signal to the first insulation resistance detector 51 for operating the first insulation resistance detector 51 during a period between time ta and time tb, and outputs an operation signal to the second insulation resistance detector 52 for operating the second insulation resistance detector 52 during a different period between time tc and time td.

Figure 19:
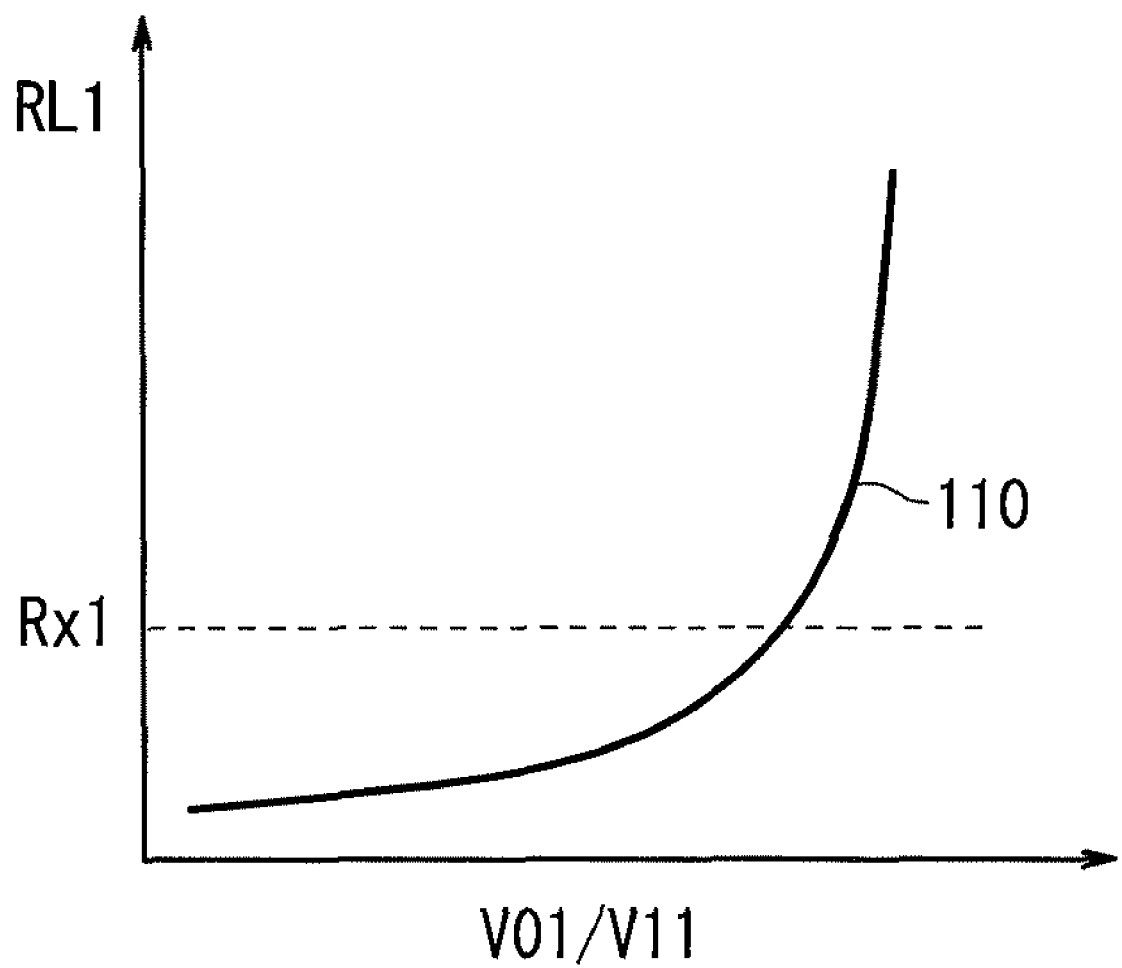
FIG. 19 is a graph showing the relationship between a voltage ratio and a first insulation resistance value.

In a first given time T1$r$ from time t0 to time t1, the first insulation resistance detector 51 charges the capacitor 106 (capacitance C1) to a voltage V01 toward the voltage E1 of the first ungrounded power supply 14. After the electric energy stored in the capacitor 106 is discharged at time t2, in a second given time T2$r$ from time t2 to time t3, the first insulation resistance detector 51 charges the capacitor 106 through the first insulation resistor RL1 (RL in FIG. 7) to a voltage V11 toward the voltage E1 of the first ungrounded power supply 14. Based on the voltage ratio between the charged voltages V01, V11 (V01/V11), the first insulation resistance detector 51 calculates the value of the first insulation resistor RL1 according to the characteristic curve 110 shown in FIG. 19.

Then, in a third given time T12$r$ from time t10 to time t11, the second insulation resistance detector 52 charges the capacitor 116 (capacitance C11) to a voltage V02 toward the voltage E2 of the second ungrounded power supply 12. After the electric energy stored in the capacitor 106 is discharged at time t12, in a fourth given time T22$r$ from time t12 to time t13, the second insulation resistance detector 52 charges the capacitor 116 through the second insulation resistor RL2 to a voltage V12 toward the voltage E2 of the second ungrounded power supply 12. Based on the voltage ratio between the charged voltages V02, V12 (V02/V12), the second insulation resistance detector 52 calculates the value of the first insulation resistor RL2 according to the characteristic curve 210 shown in FIG. 20.

Since the first and second insulation resistance values RL1, RL2 are measured at different times with respect to the voltage E1 of the first ungrounded power supply 14 and the voltage E2 of the second ungrounded power supply 12, the first and second insulation resistance values RL1, RL2 can be detected with high accuracy.

Figure 20:
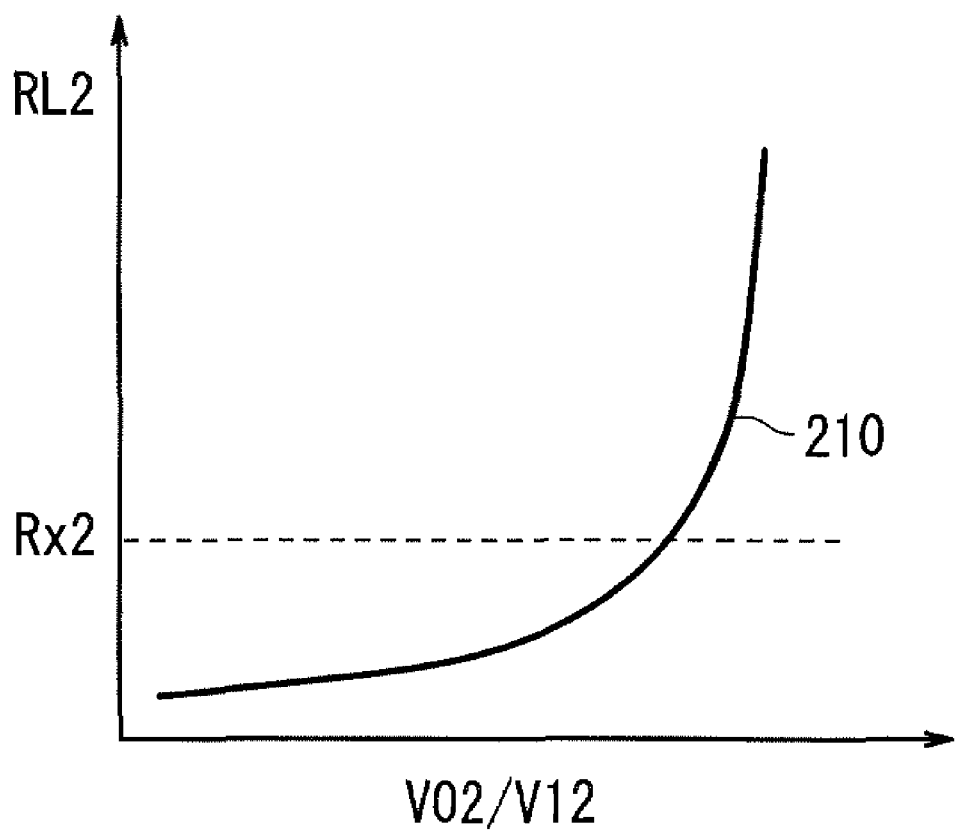
FIG. 20 is a graph showing the relationship between a voltage ratio and a second insulation resistance value.

Then, the ground fault judging unit 39 compares the measured first and second insulation resistance values RL1, RL2 respectively with an abnormal detection threshold value Rx1 (FIG. 19) and an abnormal detection threshold value Rx2 (FIG. 20). If either one of the first and second insulation resistance values RL1, RL2 is smaller than the corresponding one of the abnormal detection threshold values Rx1, Rx2 (RL1<Rx1 or RL2<Rx2), then the ground fault judging unit 39 judges that a ground fault has occurred, and issues an alarm.

Although the abnormal detection threshold values Rx1, Rx2 may be identical to each other, preferably they are set to different values such that any ground leakage current is equal to or higher than a preset level, e.g., a standard value prescribed by power supply standards.

FIG. 21 shows in block form an electric vehicle 10 incorporating a ground fault detecting system according to another embodiment of the present invention. The ground fault detecting system shown in FIG. 21 differs from the ground fault detecting system shown in FIG. 1, in that a third ground fault detector 53 is connected to the input of the inverter 22 for measuring a third insulation resistance value RL3. The ECU 40 actuates the first, second, and third ground fault detectors 51, 52, 53 during different periods in order to measure the first, second, and third insulation resistance values RL1, RL2, RL3.

Although certain preferred embodiments of the present invention have been shown and described in detail, it should be understood that various changes and modifications may be made to the embodiments without departing from the scope of the invention as set forth in the appended claims.

What is claimed is:

1. An electric vehicle incorporating a ground fault detecting system, which includes a load, a first ungrounded power supply having a voltage for supplying electric power to the load, a converter having input and output terminals connected between the load and the first ungrounded power supply, and a second ungrounded power supply having a voltage lower than the voltage of the first ungrounded power supply, and which is connected to other input and output terminals of the converter, the ground fault detecting system comprising:

a first insulation resistance detector for detecting a first insulation resistance of the first ungrounded power supply with respect to a grounded region;

a second insulation resistance detector for detecting a second insulation resistance of the second ungrounded power supply with respect to a grounded region; and a ground fault judging unit for comparing the first insulation resistance or the second insulation resistance with an abnormal detection threshold value, and judging that a ground fault has occurred if either one of the first insulation resistance and the second insulation resistance is smaller than the abnormal detection threshold value;

wherein the first insulation resistance detector and the second insulation resistance detector comprise identical circuits, respectively;

wherein the first insulation resistance detector charges a first capacitor to a charged voltage (V01) toward the voltage of the first ungrounded power supply for a first given time, discharges the first capacitor, thereafter charges the first capacitor through the first insulation resistance to a charged voltage (V11) toward the voltage of the first ungrounded power supply for a second given time, and calculates the first insulation resistance based on a ratio of the charged voltages (V01), (V11); and wherein the second insulation resistance detector charges a second capacitor to a charged voltage (V02) toward the voltage of the second ungrounded power supply for a third given time, discharges the second capacitor, thereafter charges the second capacitor through the second insulation resistance to a charged voltage (V12) toward the voltage of the second ungrounded power supply for a fourth given time, and calculates the second insulation resistance based on a ratio of the charged voltages (V02), (V12).

2. An electric vehicle according to claim 1, wherein the abnormal detection threshold value comprises a first abnormal detection threshold value and a second abnormal detection threshold value to be compared respectively with the first insulation resistance and the second insulation resistance, the first abnormal detection threshold value and the second abnormal detection threshold value being set to different values such that any leakage current value is equal to a preset level.

3. An electric vehicle according to claim 1, wherein the first insulation resistance detector and the second insulation resistance detector detect the first insulation resistance and the second insulation resistance at different times, respectively.

4. An electric vehicle according to claim 1, wherein the first ungrounded power supply comprises a fuel cell.

5. An electric vehicle according to claim 1, wherein the second ungrounded power supply comprises an electric energy storage.

* * * * *